(12) United States Patent
Chong et al.

(10) Patent No.: US 10,412,806 B2
(45) Date of Patent: Sep. 10, 2019

(54) MULTI-COLOR MICRO-LED ARRAY LIGHT SOURCE

(71) Applicant: Hong Kong Beida Jade Bird Display Limited, Hong Kong (HK)

(72) Inventors: Wing Cheung Chong, Tseung Kwan O (HK); Yijing Chen, Jiaxing (CN); Lei Zhang, Albuquerque, NM (US); Fang Ou, Monterey Park, CA (US); Qiming Li, Albuquerque, NM (US)

(73) Assignee: HONG KONG BEIDA JADE BIRD DISPLAY LIMITED, Hong Kong (CN)

( * ) Notice: Subject to any disclaimer, the term of this patent is extended or adjusted under 35 U.S.C. 154(b) by 0 days.

(21) Appl. No.: 15/701,450

(22) Filed: Sep. 12, 2017

(65) Prior Publication Data

US 2018/0132330 A1 May 10, 2018

Related U.S. Application Data

(60) Provisional application No. 62/420,260, filed on Nov. 10, 2016.

(51) Int. Cl.
*H05B 33/08* (2006.01)
*H01L 27/15* (2006.01)
*H01L 25/075* (2006.01)
*B60Q 1/06* (2006.01)
*F21S 41/125* (2018.01)
*F21S 41/143* (2018.01)
*F21S 41/32* (2018.01)
*F21Y 113/10* (2016.01)

(52) U.S. Cl.
CPC .......... *H05B 33/0857* (2013.01); *B60Q 1/06* (2013.01); *F21S 41/125* (2018.01); *F21S 41/143* (2018.01); *F21S 41/321* (2018.01); *F21S 41/322* (2018.01); *H01L 25/0753* (2013.01); *H01L 27/156* (2013.01); *F21S 41/285* (2018.01); *F21Y 2105/10* (2016.08); *F21Y 2113/10* (2016.08);
(Continued)

(58) Field of Classification Search
CPC .............. F21Y 2113/13; F21Y 2113/17; F21Y 2113/10; H05B 33/0857
See application file for complete search history.

(56) References Cited

U.S. PATENT DOCUMENTS 6,224,216 B1  5/2001 Parker et al.
8,858,033 B1  10/2014 Simon
(Continued)

OTHER PUBLICATIONS

PCT International Search Report, PCT Application No. PCT/US17/58032, dated Jan. 26, 2018, 13 pages.
(Continued)

*Primary Examiner* — Sean P Gramling
(74) *Attorney, Agent, or Firm* — Fenwick & West LLP

(57) ABSTRACT

Various embodiments include a multi-color micro-LED array light source that enables well-overlapped light beams of different colors. The multi-color micro-LED array light source includes a thermally conductive substrate and multiple arrays of different color micro-LEDs integrated on the thermally conductive substrate. The micro-LEDs within each array are electrically connected so that they can all be driven in unison. The multi-color array light source also includes a controller that is electrically coupled to and that drives the arrays of micro-LEDs. The controller drives the micro-LEDs in a manner that produces an output light distribution with a spatial wavelength and angular distribution that is suitable for use as a light source.

20 Claims, 12 Drawing Sheets

Center beams
830

820

Light source
510

(51) Int. Cl.
*F21Y 113/13* (2016.01)
*F21Y 113/17* (2016.01)
*F21Y 115/10* (2016.01)
*H01L 33/58* (2010.01)
*F21Y 105/10* (2016.01)
*F21S 41/20* (2018.01)

(52) U.S. Cl.
CPC ........ *F21Y 2113/13* (2016.08); *F21Y 2113/17* (2016.08); *F21Y 2115/10* (2016.08); *H01L 33/58* (2013.01)

(56) References Cited

U.S. PATENT DOCUMENTS

| | | |
|---|---|---|
| 2003/0218723 A1 | 11/2003 | Yamanaka |
| 2006/0018025 A1 | 1/2006 | Sharon et al. |
| 2006/0152931 A1 | 7/2006 | Holman |
| 2009/0225552 A1* | 9/2009 | Chen .................. F21V 5/04 362/333 |
| 2012/0146066 A1 | 6/2012 | Tischler et al. |
| 2014/0240378 A1* | 8/2014 | Fujioka .............. G02B 27/1066 345/690 |
| 2015/0371585 A1* | 12/2015 | Bower .................. G09G 3/32 345/1.1 |

OTHER PUBLICATIONS

Qin, Y. et al., "Low Temperature Bonding for Silicon-Based Micro-Optical Systems," Photonics, Dec. 15, 2015, pp. 1164-1201, vol. 2, No. 4, May be Retrieved at<URL:http://www.mdpi.com/2304-6732/2/4/1164/htm>.

* cited by examiner

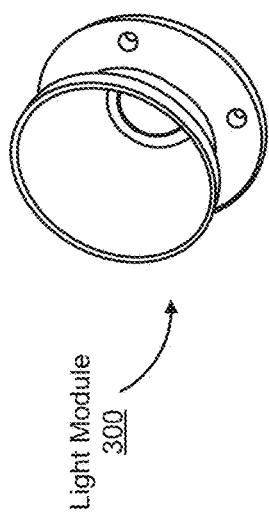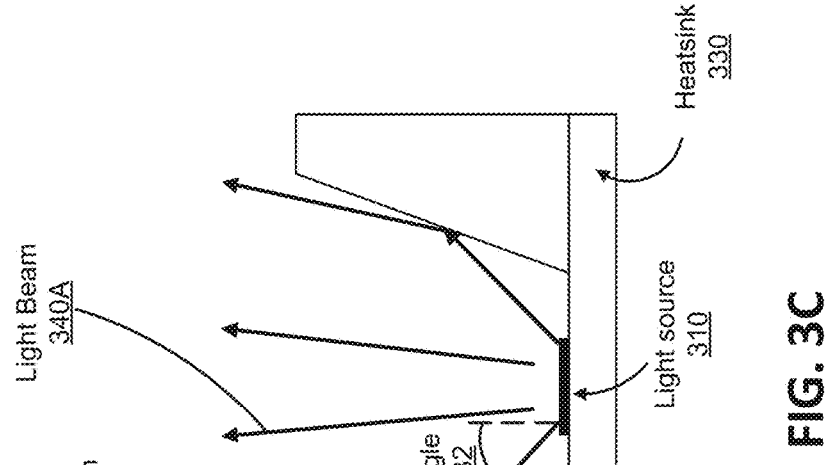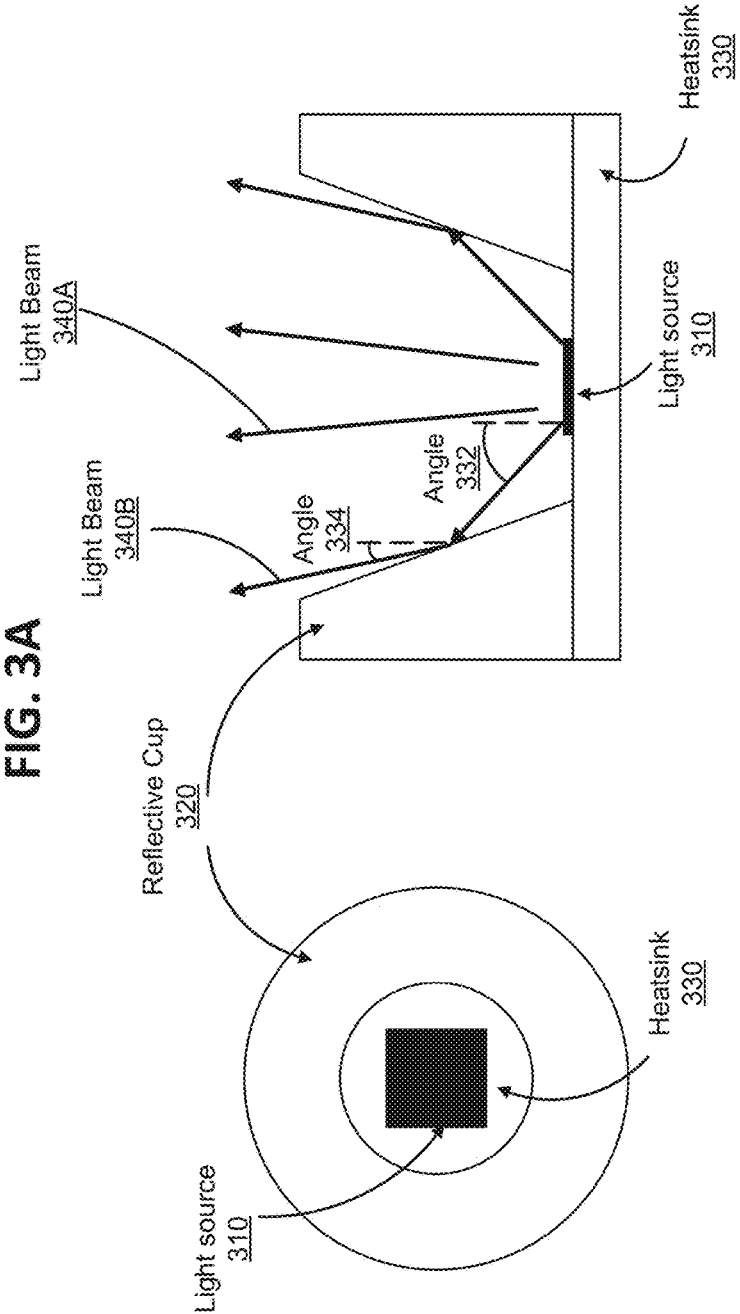

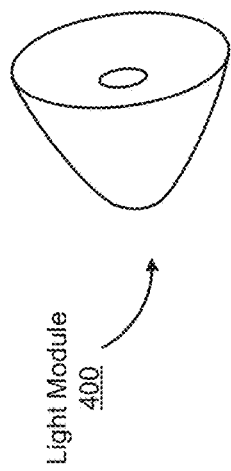
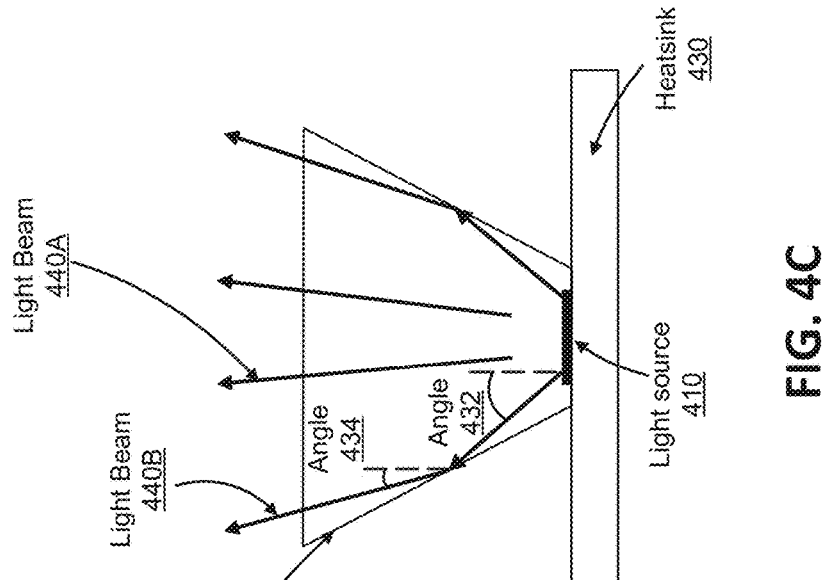
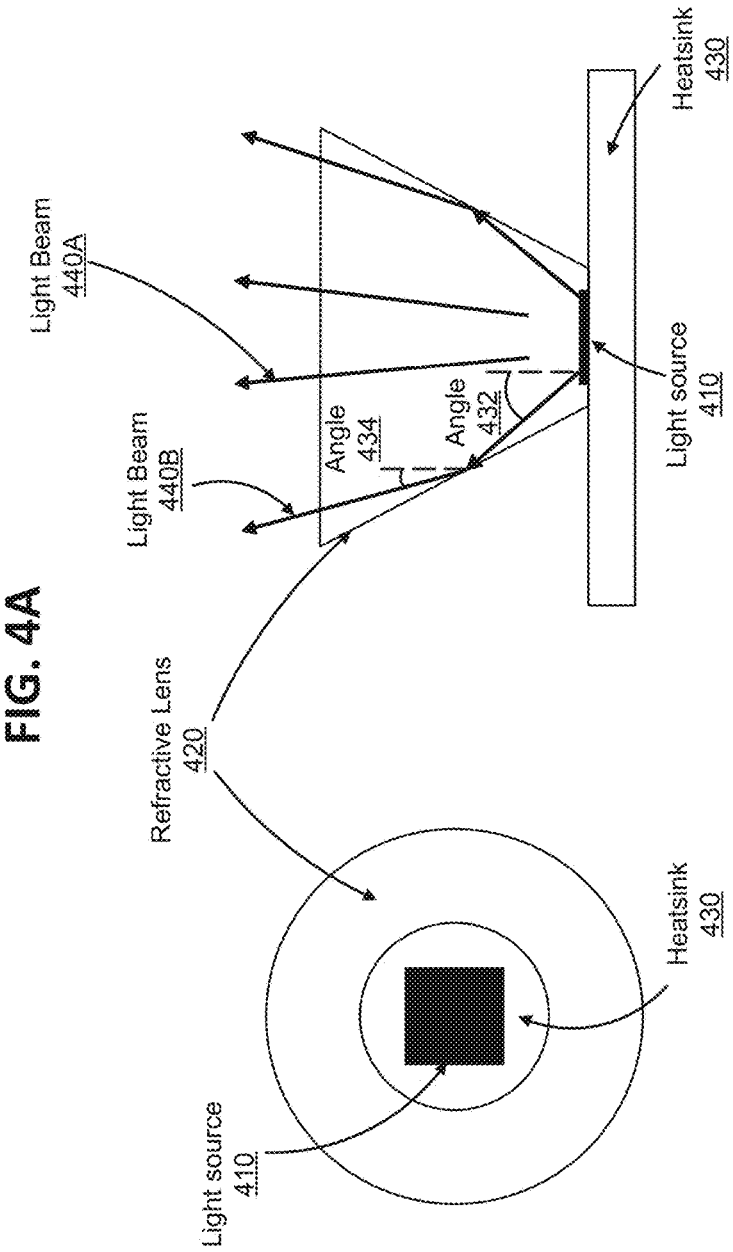

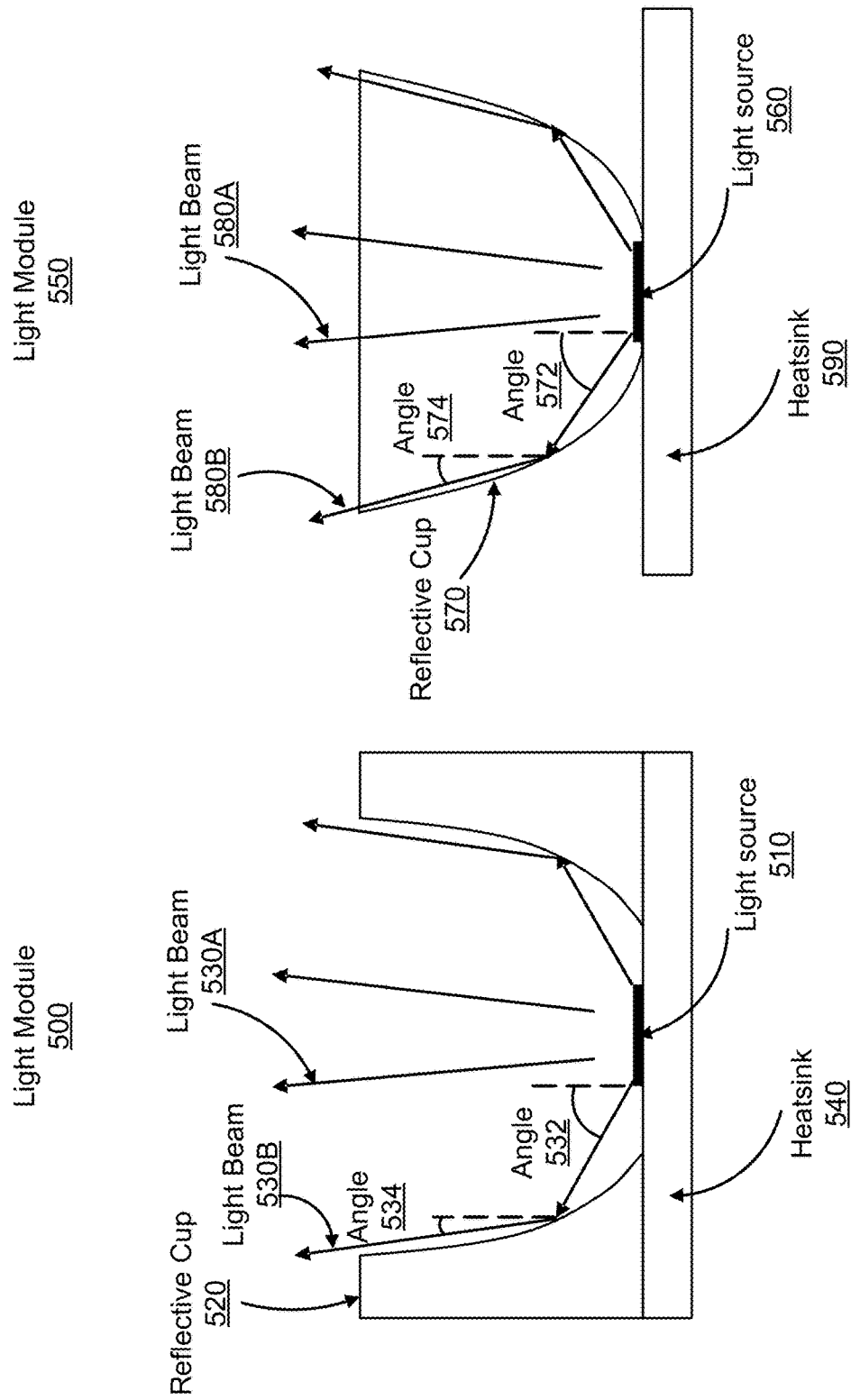

MULTI-COLOR MICRO-LED ARRAY LIGHT SOURCE

CROSS-REFERENCE TO RELATED APPLICATION(S)

This application claims priority under 35 U.S.C. § 119(e) to U.S. Provisional Patent Application Ser. No. 62/420,260, "Full color LED array light source," filed Nov. 10, 2016. The subject matter of all of the foregoing is incorporated herein by reference in their entirety.

BACKGROUND

1. Field of the Invention

This invention generally relates to a multi-color light source based on monolithically integrated micro-LED arrays, for example as may be used in applications requiring collimated full-color illumination. The micro-LED arrays of different colors are arranged in an interleaved manner to achieve more spatially uniform color mixing.

2. Description of Related Art

Light emitting diodes (LEDs) are widely used in various lighting applications such as indicator lights, traffic signal lights, LCD back lighting, and general lighting. For lighting applications that require full color adjustable lights, an integrated RGB light module, consisting of a separate red LED chip, green LED chip, and blue LED chip, has been widely adopted by the market.

Typically, each of the red, green, and blue LED chips is independently controlled by its own controller. The output light color is tuned by adjusting the amount of red, green, and blue light through the control of the current injected into the red, green, and blue LEDs. However, certain applications, such as stage lighting, environmental lighting, and color adjustable automobile headlights, also require collimated beam illumination. In a conventional RGB light module, the separate red LED chip, green LED chip, and blue LED chip are placed side by side. Such an arrangement creates a center-to-center displacement between the red, green, and blue sources that is larger than the chip size. When this RGB light source is projected using a shared projection optics, the center displacement of the projected red, green, and blue beams is magnified by the projection optics, resulting in undesirable color artifacts especially at the edge of the projected patterns. In addition, in conventional projection systems that use separate red, green, and blue LED chips, extra optical components such as multiple collimating lenses and dichroic mirrors may be required to ensure well-overlapped combination of the light from different chips. This introduces complexity and larger size to the overall system.

A multi-color light source featuring a monolithically integrated configuration and more spatially uniform color mixing is thus extensively demanded.

SUMMARY

As an example, an integrated RGB light module includes red micro-LED array(s), green micro-LED array(s), and blue micro-LED array(s) that are interleaved on a thermally conductive substrate. By replacing the separate red, green and blue LED chips of dimension L in a conventional RGB light module with interleaved N×N arrays of red, green and blue micro-LEDs of dimension L/N, the center displacement of the red, green, and blue light source is reduced by a factor of N. This can significantly reduce the color artifacts present in conventional RGB light modules.

In one aspect, a multi-color LED array light source includes a thermally conductive substrate and an array of different color micro-LEDs monolithically integrated on the thermally conductive substrate. The micro-LEDs emitting different colors are integrated on the same substrate to form a single chip. The micro-LEDs are arranged in a manner to produce output light with spatial distribution, color tunability and angular distribution that are suitable for use as a full-color collimated beam illumination light source, for example.

In one embodiment, the multi-color micro-LED array light source includes multiple arrays of micro-LEDs, with all the micro-LEDs within one array having the same color. The micro-LEDs in each array are electrically connected together, for example in series or in parallel, so they can be driven in unison, rather than being individually controlled. As one example, an RGB light source includes arrays of red, green and blue micro-LEDs. The arrays of micro-LEDs are physically arranged so that different color LEDs are interleaved. As one example, the micro-LEDs might be arranged as interleaved stripes of red LEDs, of green LEDs and of blue LEDs. As another example, the micro-LEDs may be arranged to form interleaved pixels of red LEDs, green LEDs and blue LEDs.

The light emitted from the micro-LED array light source is modulated by a controller, which could be either on-chip or off-chip. For example, the color of the output light may be controlled by driving some color LEDs more strongly than other color LEDs, or by turning on different color LEDs for different amounts of time. In addition, optical structures such as refractive and reflective optics, including non-imaging optics, may be used to shape the spatial and angular distribution of the light produced.

Compared with conventional light sources that use separate large size LED chips mounted on a substrate, an integrated multi-color micro-LED array light source allows for more uniform color mixing and better adjustment and alignment of different color output light. In addition, extra optical components required to align separate LED chips are not needed, which reduces the complexity and size of the light source and the corresponding systems that use these light sources.

The multi-color micro-LED array light source can be used in a variety of applications. Some examples include high power applications involving large size light sources, such as stage lighting, environmental lighting, and color adjustable automobile headlights. As another example, the multi-color micro-LED array light source can be used as the light source for a digital micromirror device (DMD) light engine.

Other aspects include components, devices, systems, improvements, methods, processes, applications, and other technologies related to any of the above.

BRIEF DESCRIPTION OF THE DRAWINGS

Embodiments of the disclosure have other advantages and features which will be more readily apparent from the following detailed description and the appended claims, when taken in conjunction with the accompanying drawings, in which:

FIGS. 3A-3C are different views of an example light module utilizing a multi-color micro-LED array light source with passive collimation optics, according to one embodiment.

FIGS. 4A-4C are different views of another example light module utilizing passive collimation optics, according to one embodiment.

FIGS. 5A-5B are cross-section views of yet additional example light modules utilizing passive collimation optics, according to various embodiments.

The figures depict various embodiments for purposes of illustration only. One skilled in the art will readily recognize from the following discussion that alternative embodiments of the structures and methods illustrated herein may be employed without departing from the principles described herein.

DETAILED DESCRIPTION OF THE PREFERRED EMBODIMENTS

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Figure 1:
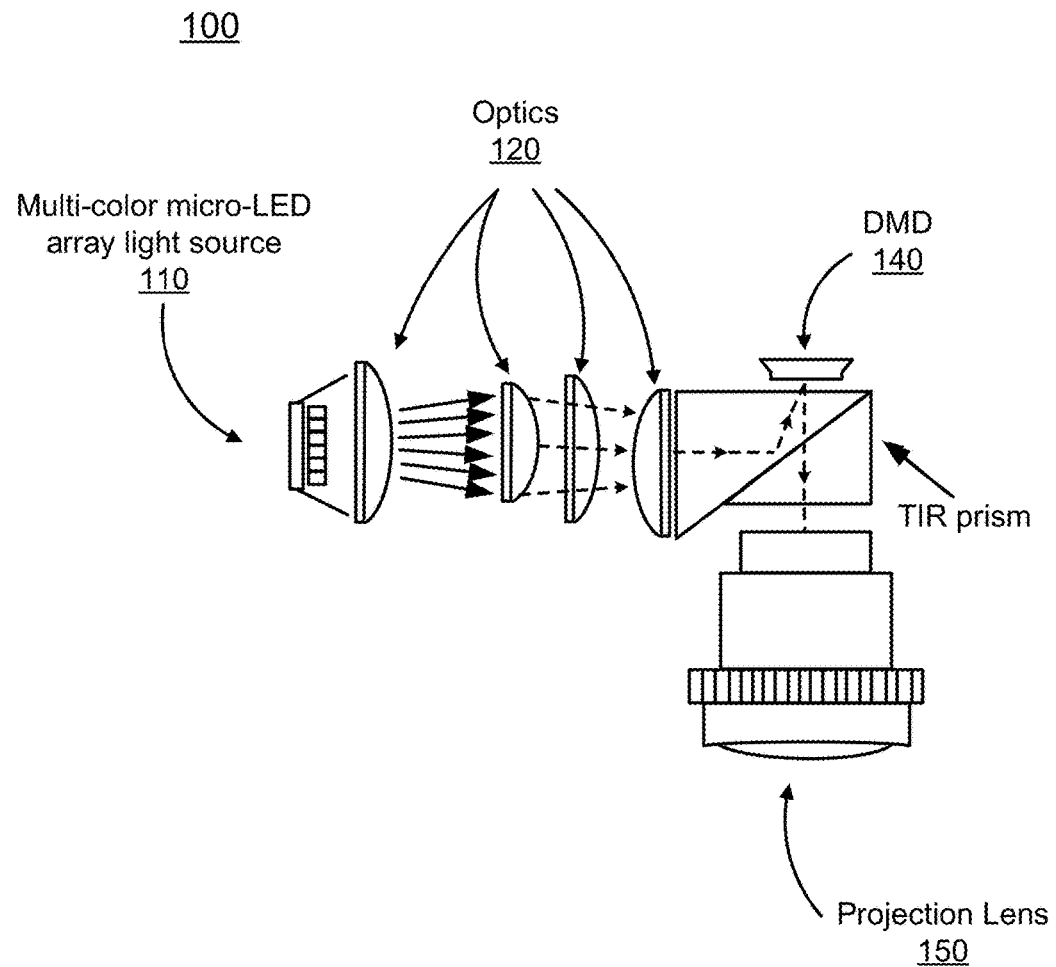
FIG. 1 shows a light engine that includes a multi-color micro-LED array light source, according to one embodiment.

FIG. 1 shows a light engine 100 that includes a multi-color micro-LED array light source 110, according to one embodiment. The light engine 100 also includes a digital micromirror device (DMD) 140 that modulates the output light from the light source 110, optics 120 that couple light from the light source 110 to the DMD 140, and a projection lens 150 that projects the modulated light for display to end users. As one example, the LED array light source 110 is an RGB light source using arrays of red, green and blue micro-LEDs. As another example, the multi-color micro-LED array light source 110 is a RGBW light source using arrays of red, green, blue and white micro-LEDs. Compared to conventional light engines that use separate large LED chips for each color, the form factor of the entire light engine 100 can be significantly reduced by replacing the multiple LED chips and corresponding optical components with the integrated multi-color micro-LED array light source 110.

The light engine of FIG. 1 is one example of an application for a multi-color micro-LED array light source, but such sources can also be used for other applications.

Figure 2A:
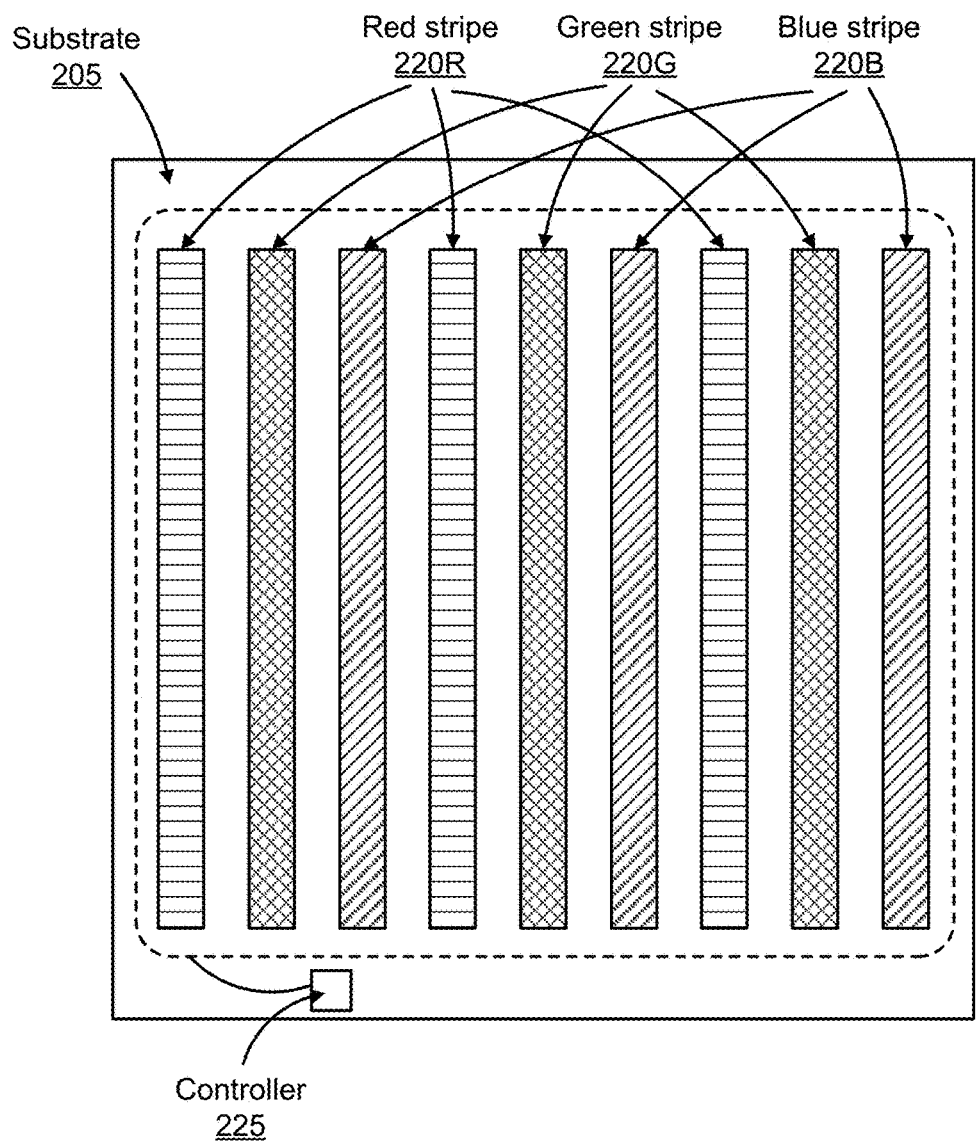
FIG. 2A is a top view of an example multi-color micro-LED array light source with interleaved stripes of red, green and blue LEDs, according to one embodiment.

FIG. 2A is a top view of an example multi-color micro-LED array light source 200 with interleaved stripes of red, green and blue LEDs 220R, 220G and 220B, according to one embodiment. In FIG. 2A, the multi-color micro-LED array light source 200 includes a substrate 205, multiple arrays of different color micro-LEDs 220 monolithically integrated on the substrate, and a controller 225 electrically coupled to drive the arrays of micro-LEDs. In this example, the controller 225 is on-chip (i.e., integrated with the LEDs on the same chip) but it could also be off-chip. The substrate 205 is a thermally conductive substrate, and can be made from materials such as aluminum nitride, aluminum oxide, silicon, aluminum, copper, and ceramic. In one embodiment, the LEDs in the multi-color micro-LED array light source 200 are micro-LEDs with a size preferably not larger than 100 microns. In the example shown in FIG. 2A, there are three stripes for each color of the LEDs, and stripes of LEDs with different colors are interleaved with each other. The stripes of LEDs starting from left to right are in an order of red, green, blue, red, green, blue, etc., with the same number of stripes for each color. In alternative embodiments, a multi-color micro-LED array light source can have a different number of stripes for each light color, and the stripes can be arranged in different orders.

With respect to fabrication, the color LEDs preferably are fabricated using epitaxial layers. In one approach, the array of different color micro-LEDs 220 is monolithically integrated onto the thermally conductive substrate 205 by transferring the epitaxial layers from a host substrate to the thermally conductive substrate via gold-gold, gold-indium or gold-tin eutectic bonding. Additional fabrication techniques are described in U.S. patent application Ser. No. 15/135,217 "Semiconductor Devices with Integrated Thin-Film Transistor Circuitry" and Ser. No. 15/269,954 "Making Semiconductor Devices with Alignment Bonding and Substrate Removal," both of which are incorporated herein by reference in their entirety.

The controller 225 drives the LEDs 220R, 220G and 220B. In FIG. 2A, the controller 225 is shown as connected to a dashed boundary that encloses the arrays of LEDs. For convenience, connections to the individual LEDs are not shown. In one embodiment, the controller 225 drives all of the same color LEDs in unison. For example, the controller 225 drives the red LEDs 220R in unison, the green LEDs 220G in unison, and the blue LEDs 220B in unison. This could be done by electrically connecting all of the same color LEDs as a single array (e.g., connecting them all in parallel or in series) and then driving that single array. Alternately, the same color LEDs could be connected as multiple arrays, but with all of the arrays driven in unison. For example, the controller 225 drives the red LEDs 220R in unison, the green LEDs 220G in unison, and the blue LEDs 220B in unison. However, different color can be driven separately from each other. In this way, the relative color content can be adjusted by the controller 225. In one approach, the controller 225 achieves this by adjusting the current used to drive the different colors. Alternatively, the controller 225 may use a time-multiplexed approach. In some cases, it may be desirable to drive all of the LEDs in unison, including LEDs of different colors.

Figure 2B:
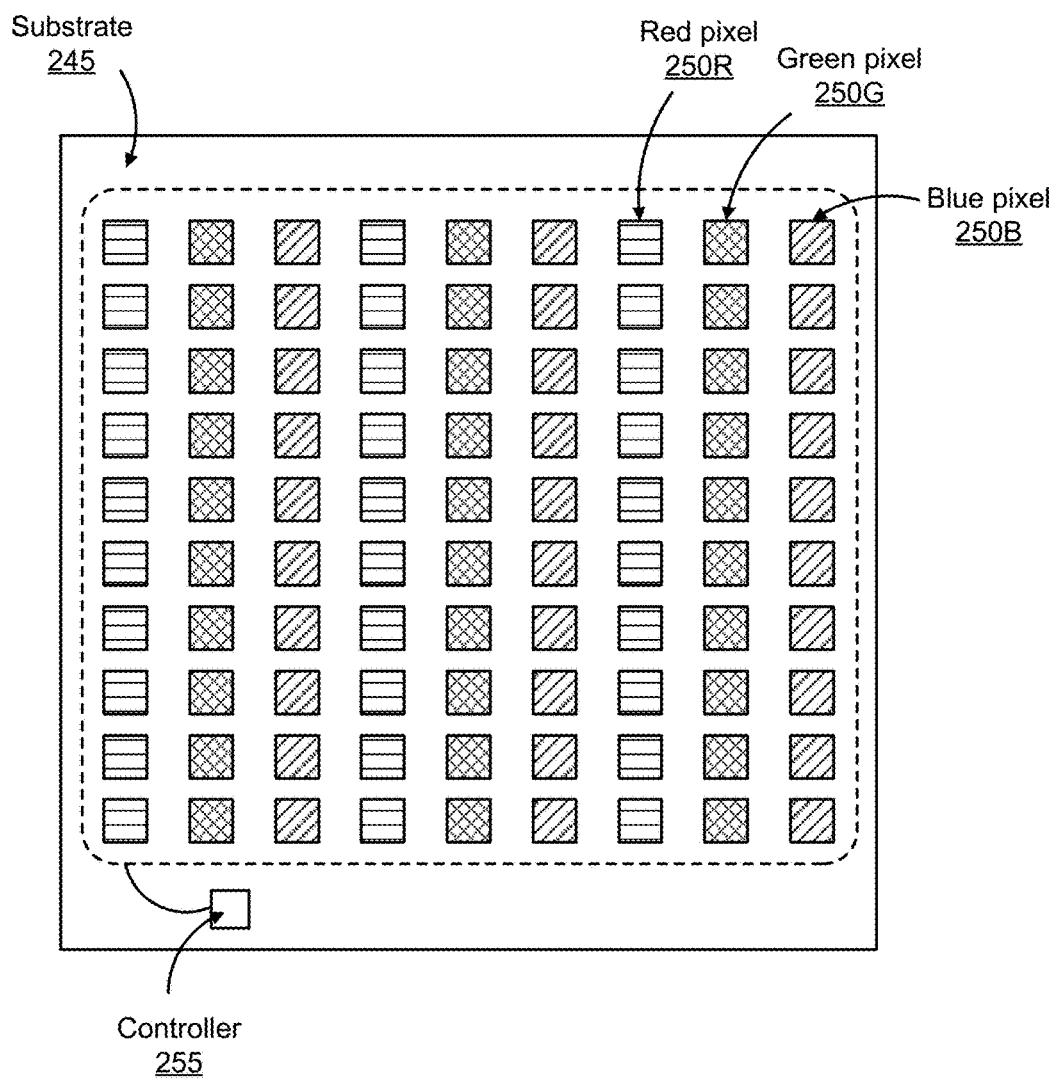
FIG. 2B is a top view of an example multi-color micro-LED array light source with interleaved pixels of red, green and blue micro-LEDs in one physical arrangement, according to one embodiment.

FIG. 2B is a top view of an example multi-color micro-LED array light source 240 with interleaved pixels of red, green and blue micro-LEDs 250R, 250G and 250B in one physical arrangement, according to one embodiment. Similar to the light source 200 shown in FIG. 2A, the light source 240 in FIG. 2B includes a substrate 245, an array of different color micro-LEDs 250R, 250G and 250B integrated on the substrate, and a controller 255 electrically coupled to drive the array of micro-LEDs. The substrate 245 is a thermally conductive substrate. In the light source 240, each micro-LED corresponds to a square pixel. The interleaved pixels of red, green and blue LEDs 250R, 250G and 250B form the multi-color micro-LED array of the light source 240. In the physical arrangement of the LEDs 250R, 250G and 250B, the LED array has nine columns of pixels with each column having individual pixels of the same color, and columns having LEDs of different colors are interleaved with each other. FIG. 2B merely shows one example of the physical arrangement of the interleaved pixels. In alternative embodiments, the micro-LED array can have a different physical arrangement, e.g., a different number of columns or rows with individual micro-LEDs.

Figure 2C:
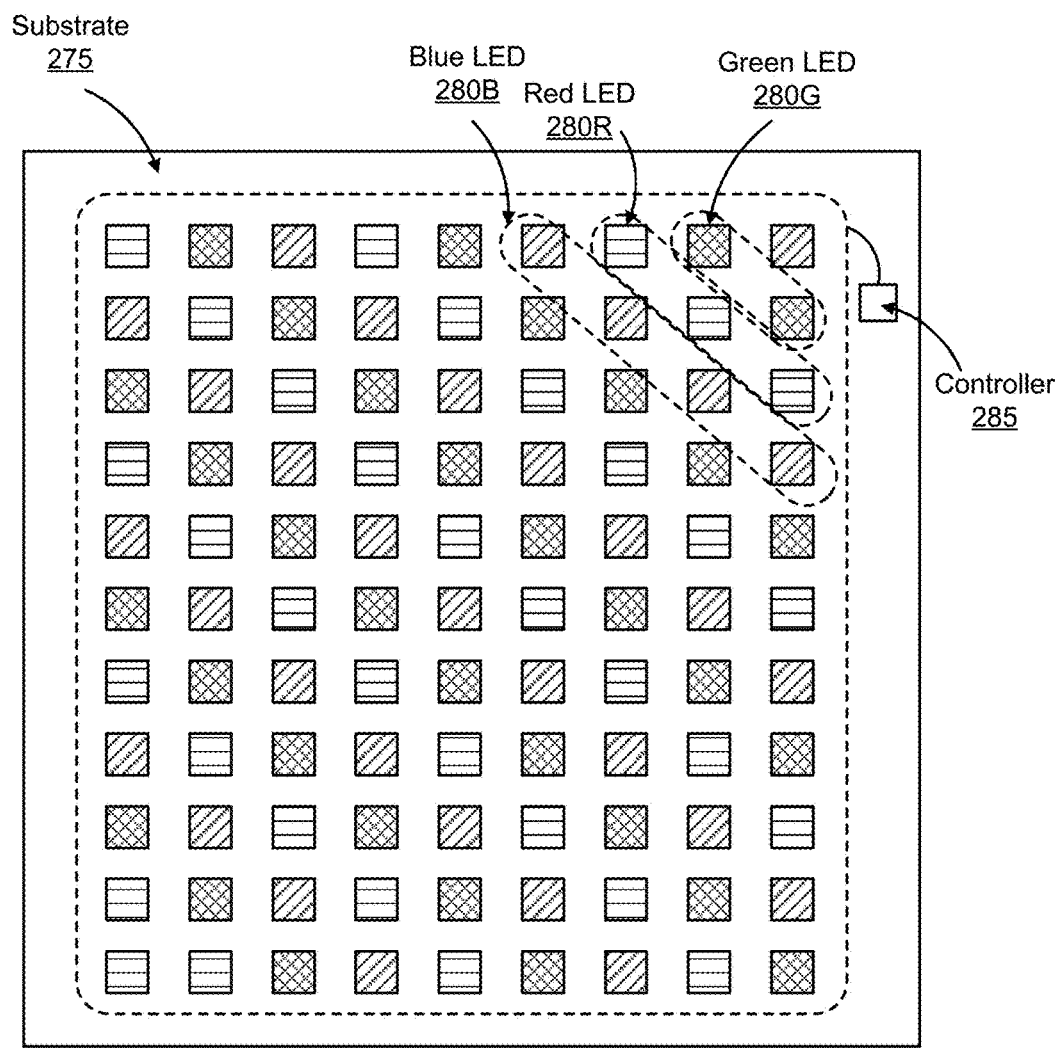
FIG. 2C is a top view of an example multi-color micro-LED array light source with interleaved pixels of red, green and blue micro-LEDs in another physical arrangement, according to one embodiment.

FIG. 2C is a top view of an example multi-color micro-LED array light source 270 with interleaved pixels of red, green and blue micro-LEDs 280R, 280G and 280B in another physical arrangement, according to one embodiment. The light source 270 includes a thermally conductive substrate 275, an array of different color micro-LEDs 280R, 280G and 280B integrated on the substrate, and a controller 285 electrically coupled to drive the array of micro-LEDs. In this example, the LEDs are arranged to form diagonals of same color LEDs, as indicated by the dashed boundaries.

FIGS. 3-11 show different examples of light modules utilizing a multi-color micro-LED array light source with additional optics to improve the angular distribution of the light produced. In these examples, a typical goal is to collimate the output light (i.e., to reduce the angular divergence of the output light) without compromising the spatial uniformity of the collimated light field. In one approach, light produced by the micro-LEDs that is within a central divergence cone (i.e., propagating parallel to the optical axis or within a certain number of degrees of the optical axis) is collimated by one set of optics, such as a collimating lens. The other light that is produced by the micro-LEDs at more oblique angles is collimated by a different set of optics, such as a reflector.

FIGS. 3A-3C are different views of an example light module utilizing a multi-color micro-LED array light source with passive collimation optics, according to one embodiment. FIG. 3A is a perspective view of the light module 300, which is an example of a multi-color light source that could be used for a projector, stage light or headlamp. FIG. 3B is a top view of the light module 300, showing the multi-color micro-LED array light source 310 mounted on a heatsink 330 and surrounded by a reflective cup 320. FIG. 3C is a cross-section view of the light module 300, showing the heatsink 330, the light source 310 mounted on the heatsink, and the reflective cup 320 surrounding the light source. The heatsink 330 acts as a mechanical base for positioning the light source 310 as well as a thermal path for removing heat.

As shown in FIG. 3C, the reflective cup 320 has a reflective inner surface surrounding air space above the light source 310. In this example, the reflective cup 320 is a conical frustum in shape. The reflective cup 320 is passive optics that reflects some of the output light from the light source 310, thus increasing the overall collimation of the light produced by the light module 300. Light beams that are already fairly collimated (such as light beam 340A) do not hit the reflective cup 320 and emerge from the light module 300 without being redirected by the passive reflector 320. In contrast, light beams that are not well collimated (such as light beam 340B) will hit the reflector 320 and be redirected to a more collimated direction. In FIG. 3C, the divergence angle of light beam 340B is reduced from angle 332 to angle 334. The divergence of the aggregate light output by the light module 300 is reduced.

FIGS. 4A-4C are different views of another example light module utilizing passive collimation optics, according to one embodiment. FIG. 4A shows a perspective view of refractive collimation optics for the light module. FIG. 4B and FIG. 4C shows a top view and a cross-section view of the light module using the refractive optics. This light module includes a multi-color micro-LED array light source 410 surrounded by refractive optics 420. It also includes a heatsink 430, with the light source 410 positioned on the heatsink. In this design, the refractive structure 420 is solid, rather than using an air space about the light source 410. The sidewalls of the refractive structure 420 reflect a portion of the output light from the light source 410. For example, light beam 440B is reflected by the side of the refractive optics 420, and its divergence angle is reduced from angle 432 to angle 434. The reflection could be due to total internal reflection, or it could be because the sidewall is coated with a reflective material.

FIGS. 5A-5B are cross-section views of yet additional example light modules 500,550 utilizing passive collimation optics 520,570, according to various embodiments. These designs are similar to the designs in FIGS. 3A-3C and FIGS. 4A-4C. They both include a multi-color micro-LED array light source 510,560 mounted on a heatsink 540,590. Each also has passive collimation optics 520,570. However, the shape of the collimation optics 520,570 are different. The shape of the optics 520,570 is generated by rotating a curve (rather than a line segment) around the central axis. In one design, these can be non-imaging optics that efficiently convert the widely diverging light produced by the relatively small light source 510,560 into maximally collimated light (with a narrower divergence angle) emerging from the full aperture of the non-imaging optics. In this design, light beams may reflect off the side of the reflector 520,570 multiple times.

Figure 6:
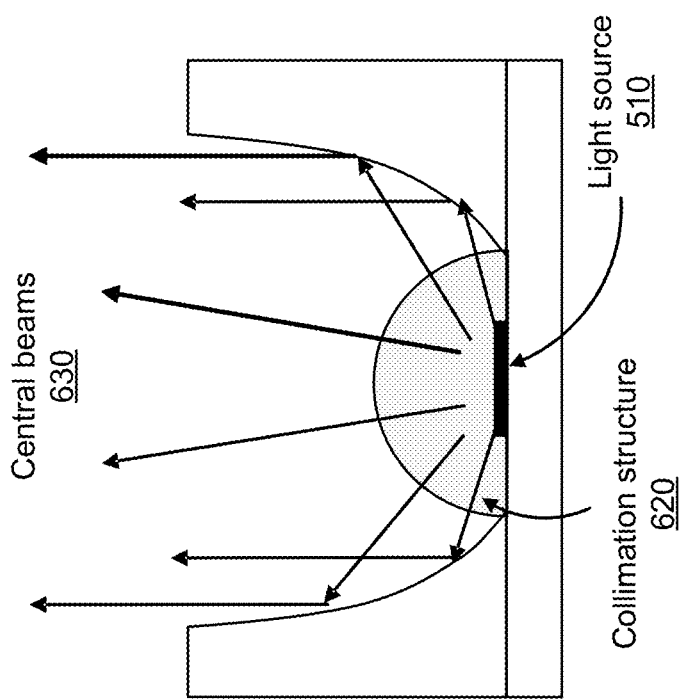
FIG. 6 is a cross-section view of yet another example light module utilizing multiple collimation structures, according to one embodiment.

FIGS. 6-11 show further enhancements to the light module shown in FIG. 5A. In FIG. 6, the light module includes an additional collimation structure 620 for collimating the central light beams 630 produced by the light source 510. The light source 510 is immersed within the additional collimation structure 620.

Figure 7:
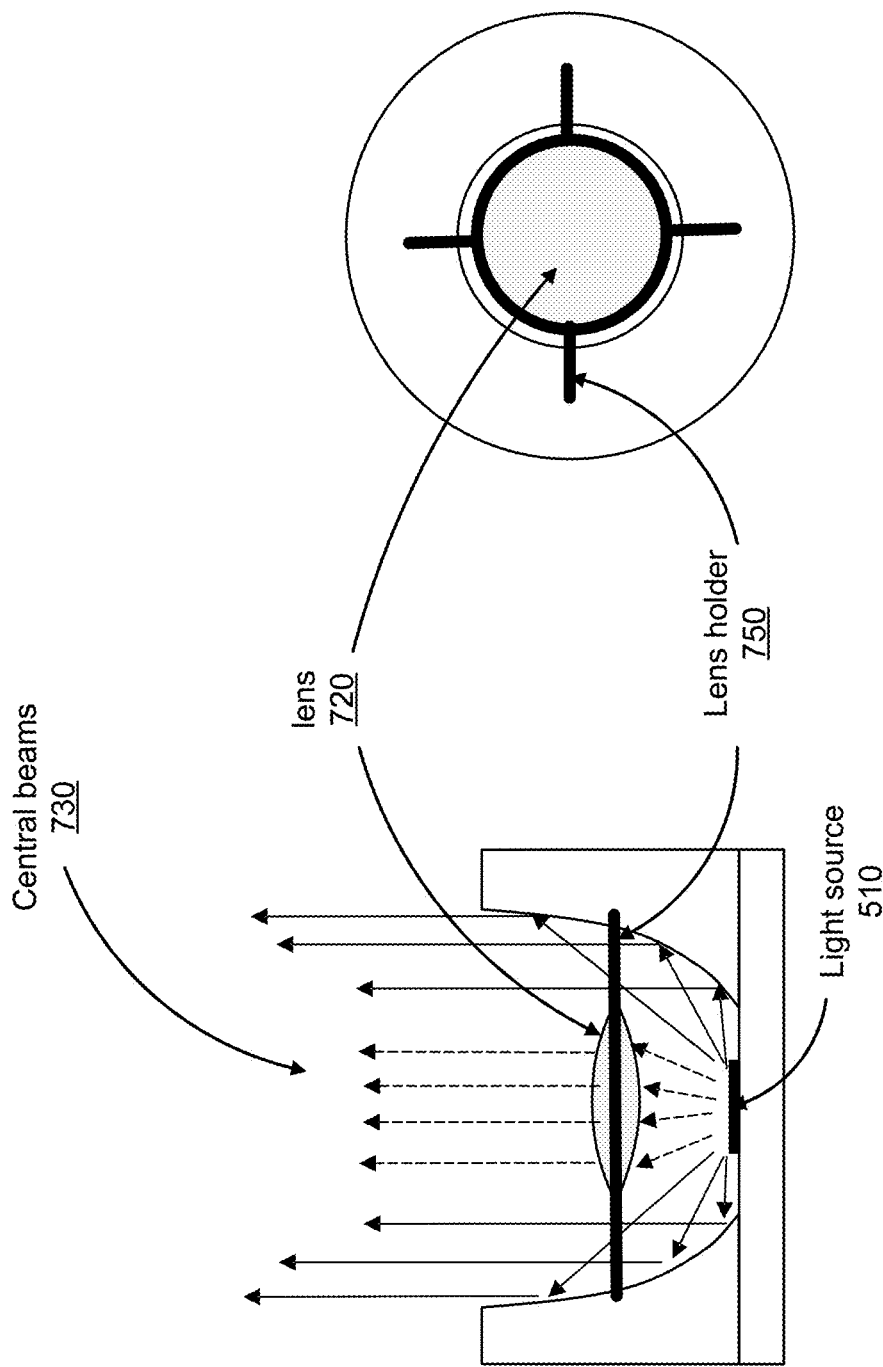
FIGS. 7A-7B are different views of yet another example light module, according to one embodiment.

FIGS. 7A-7B are different views of another example light module utilizing multi-color micro-LED array light source and passive collimation optics, according to one embodiment. FIG. 7A is a cross-section view and FIG. 7B is a top view. In FIG. 7, the light module comprises a suspended optics 720, for example a single lens, that collimates the central light beams 730, which are denoted by the dashed lines. The lens 720 is placed one focal length above the light source 510, with the optical axis of lens 720 passing through the center of the light source 510. A reflective cup is utilized to collimate the oblique angle beams from the light source 510, which are denoted by the solid lines. The top view shows one example of a lens holder 750 to keep the lens 720 suspended over the light source 510. FIG. 7 shows merely one example. In alternative embodiments, other types of additional focusing structures may be positioned above the light source 510 to collimate the central light beams.

FIGS. 8A-8C show more complex structures 820, 822, 824. These designs help to collimate the central light beams 830. In FIG. 8A, the light source 510 is immersed, but the top surface 820 of the structure is spaced apart from the light source compared to the light module of FIG. 6. In FIG. 8A, the spacing is achieved by making the structure 820 taller. In FIG. 8B, the light source 510 is not immersed. The back side of the structure 822 is hollowed to make space for the light source 510.

Figure 8:
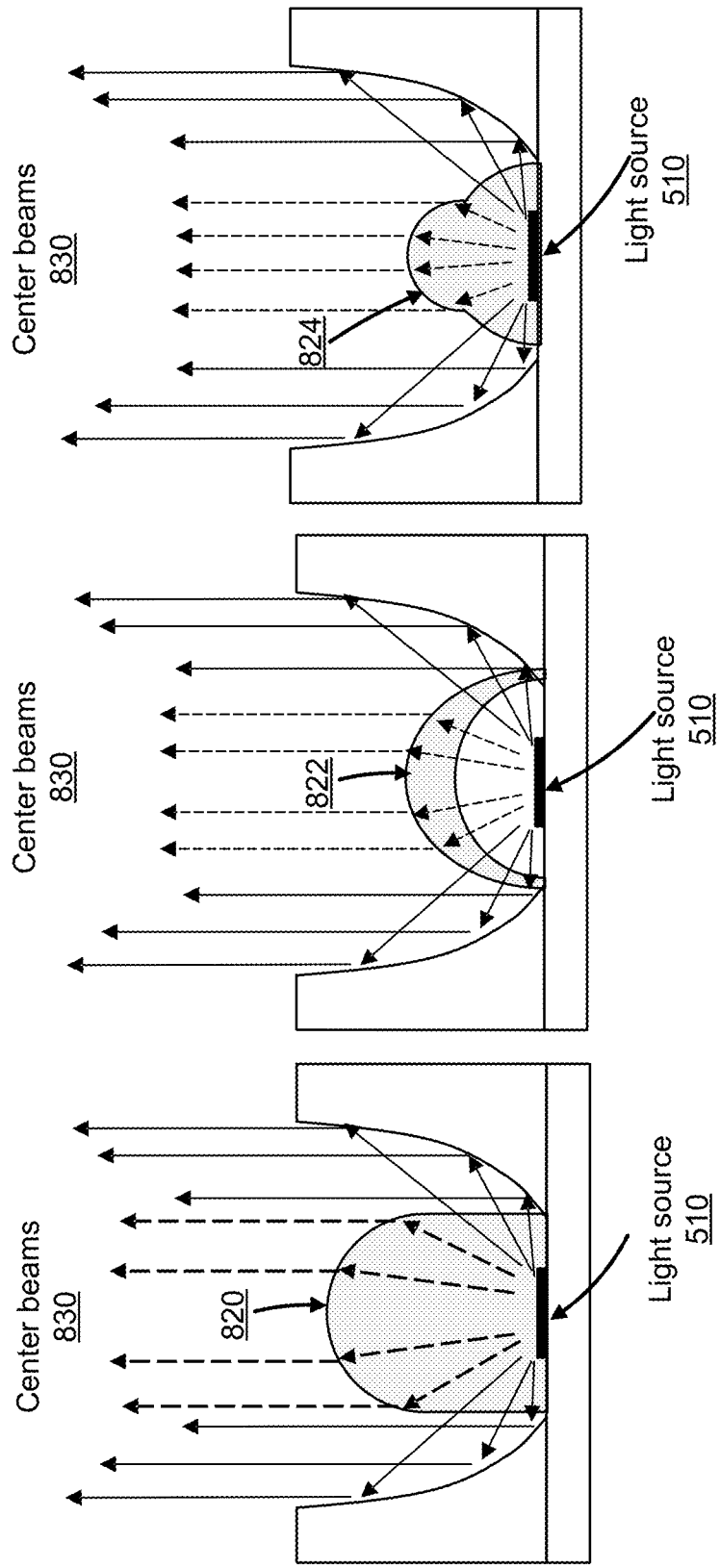
FIGS. 8A-8C are cross-section views of yet additional example light modules, according to various embodiments.

In FIG. 8C, the structure 824 has a compound top surface. The central refractive optics features a free-form surface design, in which a spherical surface 827 with radius of R1 is superimposed on top of a hemispherical surface 828 with a radius of R2, with R1<R2<2*R1. The free surface central optics is designed so that the center of the bottom hemisphere 828 of radius R2 coincides with the focal point of the lens formed by the spherical surface 827 of radius R1. The light source 510 is positioned so that its center coincides with this focal point. In this design, rays that strike surface 827 are collimated because the light source 510 is located at the focal point of that surface. Rays that strike surface 828 are not altered because the light source 510 is located at the center of that surface. These oblique beams are subsequently collimated by the surrounding reflective optics, i.e. a reflective cup. The light extraction efficiency of the multi-color micro-LED light source in FIG. 8 is increased due to the immersion in a high-refractive-index medium.

Figure 9:
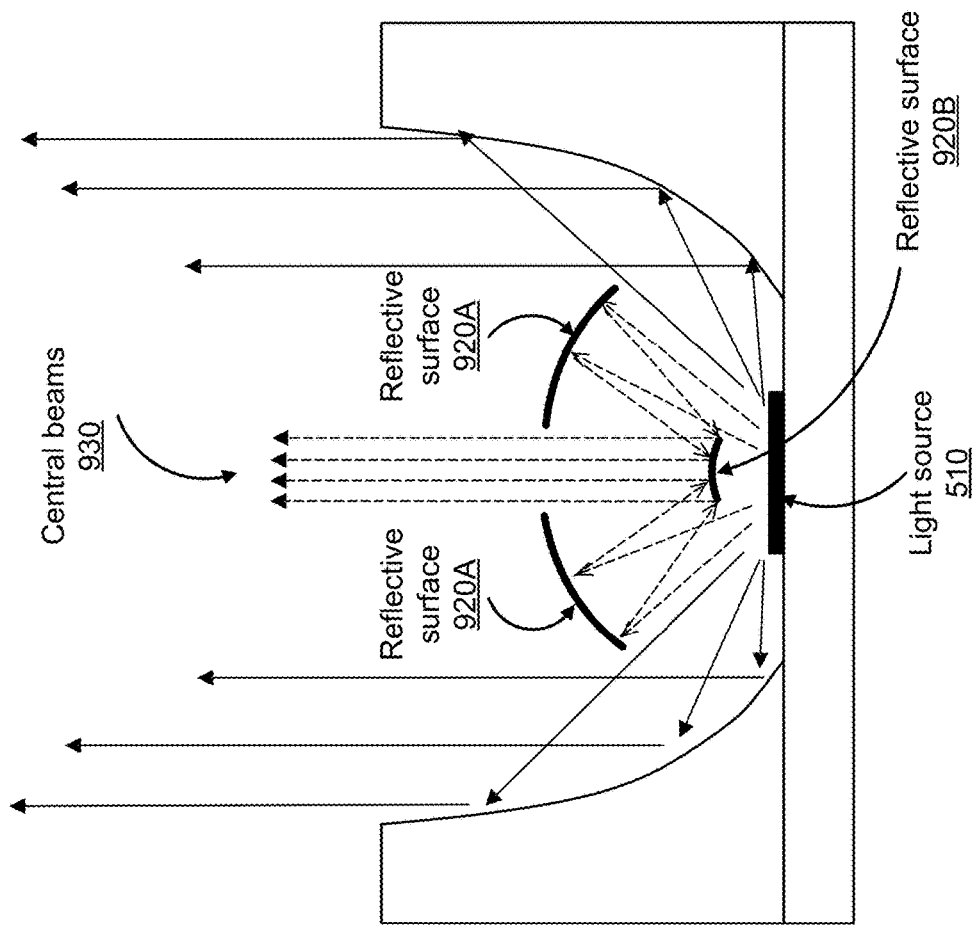
FIG. 9 is a cross-section view of yet another example light module, according to one embodiment.
Figure 10:
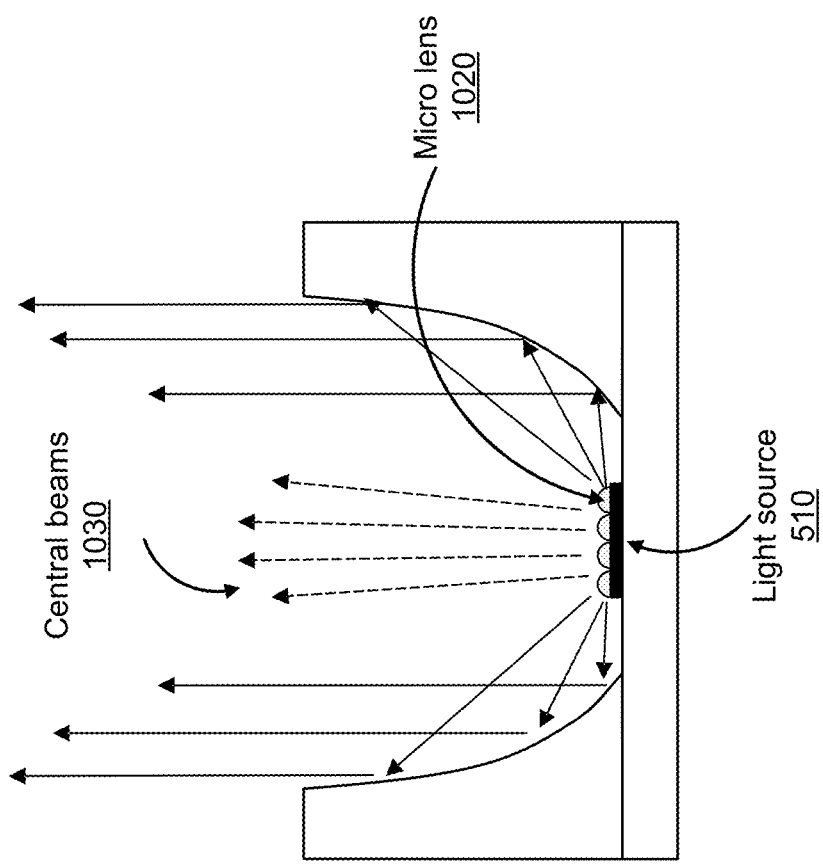
FIG. 10 is a cross-section view of yet another example light module utilizing multiple collimation structures, according to one embodiment.

FIG. 9 shows an approach using reflective optics 920. Here, reflective surfaces 920A-920B collimate the central light beams 930. In FIG. 10, a microlens array 1040 are used to collimate the central light beams 1130.

Although the detailed description contains many specifics, these should not be construed as limiting the scope of the invention but merely as illustrating different examples. It should be appreciated that the scope of the disclosure includes other embodiments not discussed in detail above. Various other modifications, changes and variations which will be apparent to those skilled in the art may be made in the arrangement, operation and details of the method and apparatus disclosed herein without departing from the spirit and scope as defined in the appended claims. Therefore, the scope of the invention should be determined by the appended claims and their legal equivalents.

What is claimed is:

1. A multi-color micro-LED array light source comprising:
   a thermally conductive substrate;
   multiple arrays of micro-LEDs monolithically integrated on the thermally conductive substrate, wherein the micro-LEDs from all of the arrays in aggregate comprise at least two different color micro-LEDs arranged in an interleaved manner and each array comprises:
   a plurality of micro-LEDs that are all a same color;
   a driver input for receiving a driver signal for the plurality of micro-LEDs; and
   electrical connections that connect the plurality of micro-LEDs to the driver input, wherein the plurality of micro-LEDs are driven in unison by the driver signal; and
   passive collimation optics integrated on the thermally conductive substrate, the passive collimation optics comprising:
   a reflective cup having a base, the arrays of micro-LEDs positioned at a base of the reflective cup, the reflective cup collimating light produced by the arrays of micro-LEDs outside a central divergence cone; and
   refractive optics having a single refractive surface, the refractive optics positioned at the base of the reflective cup so that the arrays of micro-LEDs are immersed within the refractive optics, the refractive optics collimating light produced by the arrays of micro-LEDs within the central divergence cone.

2. The multi-color micro-LED array light source of claim 1, wherein each micro-LED has at least one lateral dimension smaller than 100 microns.

3. The multi-color micro-LED array light source of claim 1, wherein each micro-LED has all lateral dimensions smaller than 100 microns.

4. The multi-color micro-LED array light source of claim 1, wherein the multiple arrays of micro-LEDs comprise at least one array of red micro-LEDs, at least one array of green micro-LEDs and at least one array of blue micro-LEDs.

5. The multi-color micro-LED array light source of claim 4, wherein the multiple arrays of micro-LEDs further comprise at least one array of white micro-LEDs.

6. The multi-color micro-LED array light source of claim 1, wherein the multiple arrays of micro-LEDs include at least two arrays of each different color of micro-LEDs.

7. The multi-color micro-LED array light source of claim 1, wherein, for each array, all the micro-LEDs within the array are electrically connected in parallel or in series.

8. The multi-color micro-LED array light source of claim 1, further comprising:
   a controller that generates the driver signals for the multiple arrays of different color micro-LEDs.

9. The multi-color micro-LED array light source of claim 8, wherein the controller drives all of the micro-LEDs for each of the different colors in unison, but drives each different color separately from each other.

10. The multi-color micro-LED array light source of claim 8, wherein the controller drives all of the micro-LEDs for all of the different colors in unison.

11. The multi-color micro-LED array light source of claim 1, wherein the micro-LEDs are stripes, with different color stripes interleaved along one lateral dimension.

12. The multi-color micro-LED array light source of claim 1, wherein the micro-LEDs are pixels, with different color pixels interleaved along two lateral dimensions.

13. The multi-color micro-LED array light source of claim 1, wherein the micro-LEDs are thin-film micro-LEDs comprising epitaxial layers, n-electrodes, and p-electrodes, with a growth substrate removed.

14. The multi-color micro-LED array light source of claim 13, wherein the thin-film micro-LEDs are monolithically integrated on the thermally conductive substrate by transferring the epitaxial layers from a host substrate to the thermally conductive substrate via eutectic bonding.

15. The multi-color micro-LED array light source of claim 1, wherein the refractive optics includes a refractive lens centered on and positioned one focal length above the arrays of micro-LEDs.

16. The multi-color micro-LED array light source of claim 1, wherein the refractive optics is a free-form refractive optics.

17. The multi-color micro-LED array light source of claim 1, wherein the refractive optics includes a refractive lens superimposed on top of a refractive hemisphere with a focal point of the refractive lens coincident with a center of the refractive hemisphere, the arrays of micro-LEDs positioned at the center of the refractive hemisphere.

18. A light engine comprising:
   a multi-color micro-LED array light source comprising:
   a thermally conductive substrate; and
   multiple arrays of micro-LEDs monolithically integrated on the thermally conductive substrate, wherein the micro-LEDs from all of the arrays in aggregate comprise at least two different color micro-LEDs arranged in an interleaved manner and each array comprises:

a plurality of micro-LEDs that are all a same color;

a driver input for receiving a driver signal for the plurality of micro-LEDs; and electrical connections that connect the plurality of micro-LEDs to the driver input, wherein the plurality of micro-LEDs are driven in unison by the driver signal; and passive collimation optics integrated on the thermally conductive substrate, the passive collimation optics comprising:

a reflective cup having a base, the arrays of micro-LEDs positioned at a base of the reflective cup, the reflective cup collimating light produced by the arrays of micro-LEDs outside a central divergence cone; and refractive optics having a single refractive surface, the refractive optics positioned at the base of the reflective cup so that the arrays of micro-LEDs are immersed within the refractive optics, the refractive optics collimating light produced by the arrays of micro-LEDs within the central divergence cone;

a digital micromirror device that modulates the output light distribution from the multi-color micro-LED array light source;

optics that collimates the output light distribution from the multi-color LED array light source to the digital micromirror device; and a projection lens that projects the modulated light for display to end users.

19. The light engine of claim 18 wherein the multi-color micro-LED array light source further comprises:

a controller that generates the driver signals for the multiple arrays of different color micro-LEDs, and the controller drives all of the micro-LEDs for each of the different colors in unison.

20. The light engine of claim 18 wherein the refractive optics includes a refractive lens superimposed on top of a refractive hemisphere with a focal point of the refractive lens coincident with a center of the refractive hemisphere, the arrays of micro-LEDs positioned at the center of the refractive hemisphere.

* * * * *